United States Patent [19]
Wagner et al.

[11] Patent Number: 5,164,020
[45] Date of Patent: Nov. 17, 1992

[54] SOLAR PANEL

[75] Inventors: Erich Wagner, Levittown; Edward N. Twesme, Willow Grove; Craig Hidalgo, Levittown, all of Pa.

[73] Assignee: Solarex Corporation, Rockville, Md.

[21] Appl. No.: 705,381

[22] Filed: May 24, 1991

[51] Int. Cl.[5] ............... H01L 31/048; E04D 13/18
[52] U.S. Cl. ............................... 136/251; 136/244; 136/291; 52/173 R
[58] Field of Search .............. 136/251, 291, 244; 52/173 R; 126/DIG. 2

[56] References Cited

U.S. PATENT DOCUMENTS

| | | | |
|---|---|---|---|
| 3,116,171 | 12/1963 | Nielsen et al. | 136/245 |
| 4,019,924 | 4/1977 | Kurth | 136/251 |
| 4,040,867 | 8/1977 | Forestieri et al. | 136/244 |
| 4,189,881 | 2/1980 | Hawley | 52/220 |
| 4,331,492 | 5/1982 | Dominguez et al. | 156/66 |
| 4,336,413 | 6/1982 | Tourneux | 136/251 |
| 4,443,652 | 4/1984 | Izu et al. | 136/251 |
| 4,582,953 | 4/1986 | Nagase et al. | 136/259 |
| 4,611,090 | 9/1986 | Catella et al. | 136/251 |
| 4,636,577 | 1/1987 | Peterpaul | 136/206 |
| 4,677,248 | 6/1987 | Lacey | 136/244 |
| 4,692,557 | 9/1987 | Samuelson et al. | 136/251 |
| 4,830,038 | 5/1989 | Anderson et al. | 136/251 |
| 4,832,755 | 5/1989 | Barton et al. | 136/251 |
| 4,860,509 | 8/1989 | Laaly et al. | 52/173 R |
| 4,877,460 | 10/1989 | Flödl | 136/244 |
| 4,936,063 | 6/1990 | Humphrey | 52/200 |
| 4,953,577 | 9/1990 | Marshall | 136/251 |
| 5,092,939 | 3/1992 | Nath et al. | 136/251 |

FOREIGN PATENT DOCUMENTS

| | | | |
|---|---|---|---|
| 1900069 | 9/1970 | Fed. Rep. of Germany. | |
| 59-175169 | 10/1984 | Japan | 136/291 |

Primary Examiner—Aaron Weisstuch
Attorney, Agent, or Firm—James A. Gabala; William H. Magidson; Frank J. Sroka

[57] ABSTRACT

A solar panel for use in a roof mounted array of solar panels, each panel having ridges protruding outwardly and adjacent to the side edges for receiving a standing seam cap between side-adjacent panels. Each solar panel is formed as an integral structure having a photovoltaic module an edge of which is sealed by a base substrate. The base substrate is configured to have lipped top and bottom edges which interlock to form a watertight seal between top-adjacent and bottom-adjacent solar panels. The solar panel array can be mounted on a roof, in place of shingles or the like, to provide environmental protection for the interior of a building.

41 Claims, 6 Drawing Sheets

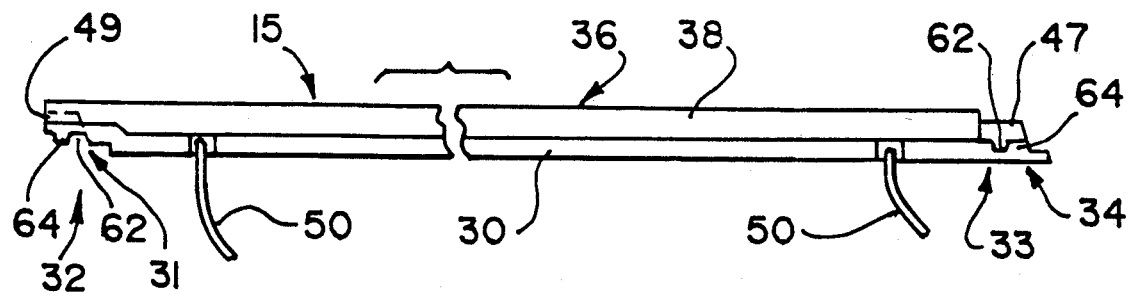
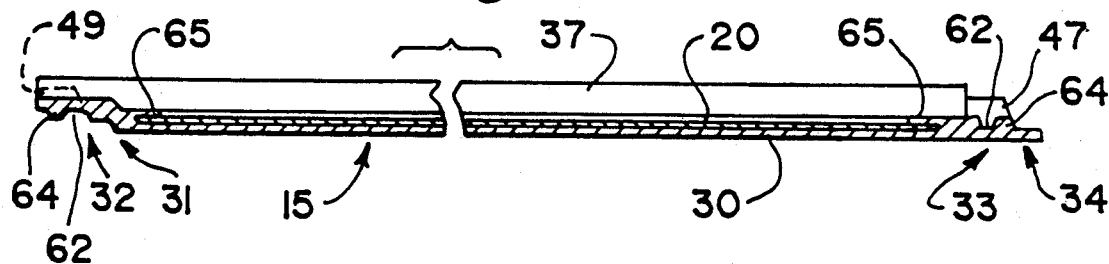
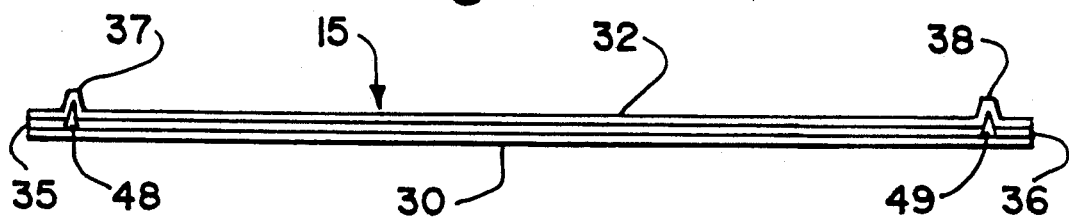
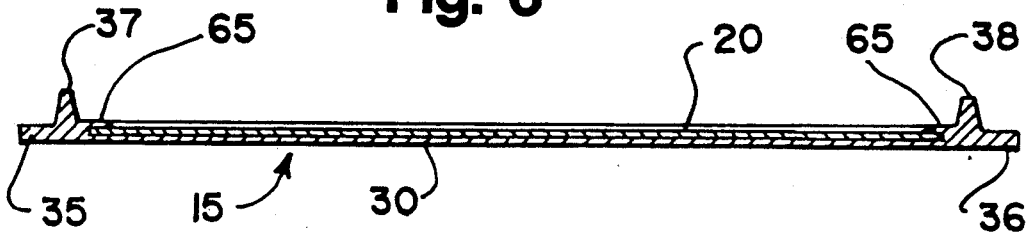

SOLAR PANEL

BACKGROUND OF THE INVENTION

1. Field of the Invention

The present invention relates in general to solar panels for use in a roof-mounted array and, more particularly, to a solar panel that provides environmental protection to its photovoltaic cells, is easily installed and replaced, and that can serve as a roofing panel eliminating the need for shingles or tar paper.

2. Discussion of the Related Art

It is a known practice to mount solar panel arrays on rooftops where they are most likely to receive a maximum amount of sunlight without interference from trees, buildings or other obstructions. One method for mounting an array of solar panels on a roof is to first assemble the solar panels on a support to form the array, and then to secure the supported array on the existing rooftop. A problem with this mounting method is the difficulty involved with lifting and mounting the array onto the roof without damaging the solar panels. Further, in view of the substantial weight of the assembled array, special equipment is needed to lift the array onto the roof.

Another method for mounting an array of solar panels on a roof is to mount the solar panels individually and directly onto the surface of the roof to form the solar panel array. This method obviates the above described difficulties because it enables the installers to carry the individual solar panels up to the roof and mount them one at a time.

One need that arises in mounting an array of solar panels directly onto a roof is a need for provision of a convenient path for running the electrical conduits which carry the wiring that electrically interconnects the solar panels. U.S. Pat. No. 4,189,881 issued to Hawley, provides a solution to this problem in a batten-seam roofing system constituted by pans which longitudinally extend from the top of the roof to the bottom. The pans are secured to the roof using clips. The clips are placed over the lipped edges of the adjacent pans and screwed into the roof such that the pans are spaced apart. Individual photovoltaic cell modules are mounted on and secured to the long pans. Batten seam caps are placed over the gaps between pans to create channels for the electrical conduits that carry the wiring for the photovoltaic cells.

One possible drawback to such a construction method is the need for additional hardware to secure the photovoltaic cell modules to the pans. Also, mounting the array on the roof involves a two step process of first mounting the pans on the roof and then mounting the photovoltaic cell modules to the pans. Further, because the photovoltaic cell modules must be secured to the pans directly, the likelihood that one of the modules will be damaged is increased.

Another problem with conventional roof-mounted solar panel arrays is their limited ability to endure outside environmental conditions. Roof-mounted solar panels are often damaged by adverse weather conditions, thus increasing the frequency with which they need t be replaced and therefore the cost of maintaining the roof-mounted array.

SUMMARY OF THE INVENTION

The present invention has been made in view of the above circumstances and has as an object to provide a roof-mounted solar panel array that is constructed to enable easy replacement of damaged solar panels.

A further object of the present invention is to provide a roof-mounted solar panel array that is constructed with environmentally protected solar panels.

Another object of the present invention is to provide a roof-mounted solar panel array comprising solar panels that can be assembled to provide environmental protection for the interior of a building without the need of shingles, tar paper, or other conventional roofing materials.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the solar panel of this invention comprises a base substrate including a front surface, a back surface for mounting on the roof substructure, first and second longitudinally extending side edges, a bottom edge portion having an extending first lip, a top edge portion having an extending second lip configured to matingly join with the first lip of the bottom edge portion of a top-adjacent one of the solar panels, and first and second ridges protruding from the front surface and respectively disposed parallel and adjacent to the first and second side edges, each of the first or second ridges being configured to receive the standing seam cap to be mounted thereon and onto the second or first ridge, respectively, of the side-adjacent one of the solar panels, and a photovoltaic module mounted on the front surface of the base substrate.

It is to be understood that both the foregoing general description and the following detailed description are exemplary and explanatory only and are not restrictive of the invention, as, claimed.

The accompanying drawings, which are incorporated in and constitute a part of this specification, illustrate several embodiments of the invention and, together with the description, serve to explain the principles of the invention.

BRIEF DESCRIPTION OF THE DRAWINGS

In the drawings,

FIG. 3 is a side view of a side edge of the solar panel illustrated in FIG. 1A;

FIG. 4 is a section view taken along line B—B of FIG. 1A;

FIG. 5 is a side view of a bottom edge of the solar panel illustrated in FIG. 1A;

FIG. 6 is a section view taken along line A—A of FIG. 1A;

DETAILED DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Figure 1A:
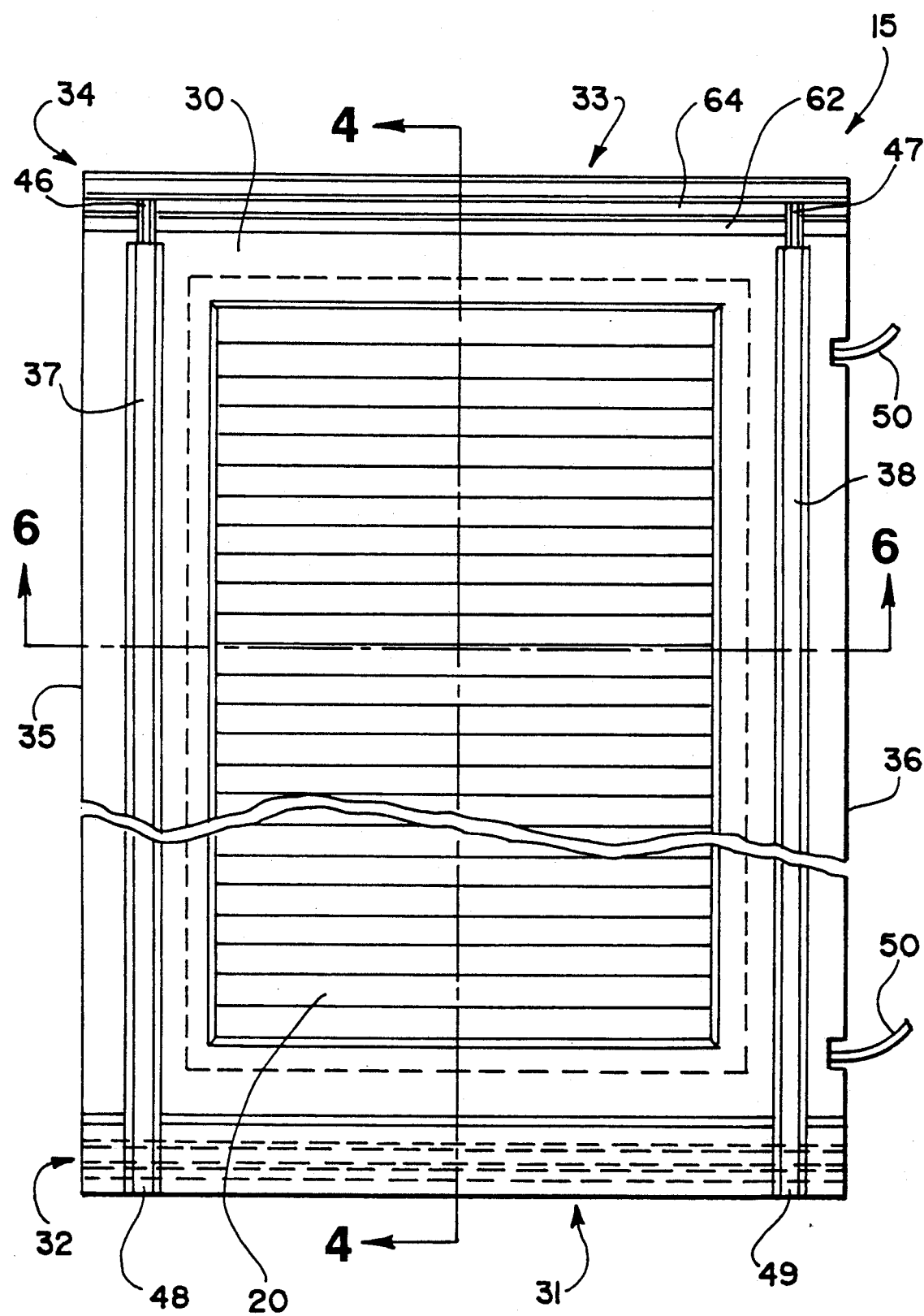
FIG. 1A is a front view of a solar panel constructed in accordance with the present invention.
Figure 1B:
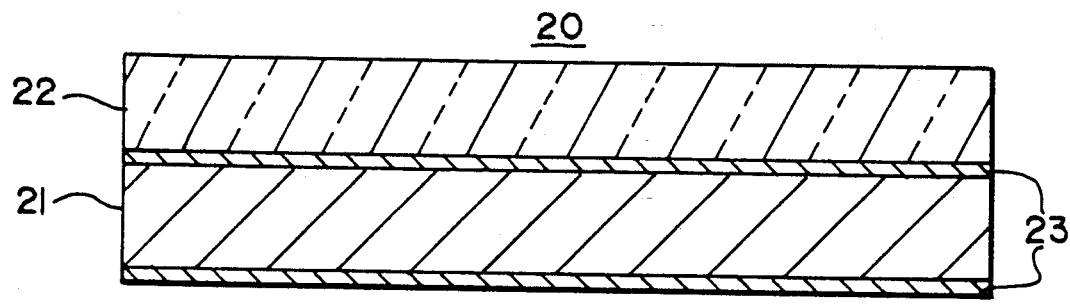
FIG. 1B is a section view of a photovoltaic module in accordance with a preferred embodiment of the present invention.

FIG. 1A shows a front view of a solar panel 15 constructed in accordance with the present invention. Solar panel 15 includes a photovoltaic module 20 and a base substrate 30. FIG. 1B illustrates possible constructions of photovoltaic module 20. The term photovoltaic module as used herein and embodied in module 20 broadly describes the structure of a plurality of electrically coupled photovoltaic cells 21 and a transparent protective substrate 22 that both covers a front, solar radiation receiving surface of the photovoltaic cells and constitutes a front surface of module 20. Photovoltaic cells 21 may be any type of photovoltaic cell including amorphous silicon (a-Si) P-I-N or polycrystalline P-N types. Transparent protective substrate 22 may be formed of any material transparent to solar radiation, the preferred material being glass. A barrier coating 23 is preferably applied on the back surface of photovoltaic cells 21 when a-Si P-I-N type photovoltaic cells are used. When polycrystalline P-N type photovoltaic cells are used, barrier coating 23 is preferably applied to both the front and back surfaces of the photovoltaic cells 21. Barrier coating 23 is preferably a mixture of a two-component fluorinated polyurethane with 3-glycidoxy propyltrimethoxy silane and is preferably provided as disclosed in commonly assigned U.S. Pat. No. 4,953,577 issued to Marshall, the disclosure of which is incorporated by reference. Preferred embodiments of barrier coating 23 particularly for polycrystalline p-n type photovoltaic cells include an ethylene vinyl acetate (EVA) copolymer commonly applied in a vacuum lamination process.

Base substrate 30 may be molded from polymeric materials which include crosslinkable, thermosetting, thermoplastic materials, or foamable types of polymers, the preferred material being polyurethane.

In accordance with a preferred embodiment of the invention, solar panel 15 is constructed by setting photovoltaic module 20 in a mold for forming base substrate 30 to surround and support photovoltaic module 20. The mold is configured such that none of the base substrate material is allowed to cover a central active portion of the front surface of the photovoltaic module 20. Further, the mold is preferably designed such that the molded material of base substrate 30 seals the back, the edges, and a peripheral portion of the front surface of photovoltaic module 20, as depicted in FIGS. 4, 6, 8(a), and 8(b). As a result, the transparent protective layer on the front surface of the photovoltaic module 20 and the molded base substrate 30 cooperate to effectively completely encapsulate and protect the photovoltaic module 20 from weathering.

In accordance with a preferred embodiment of the invention, a reaction injection molding (RIM) process is used to form base substrate 30. An example of a suitable method for practicing the RIM process is disclosed in U.S. Pat. No. 4,830,038 issued to Anderson et. al., the disclosure of which is incorporated herein by reference.

By molding base substrate 30 in the manner described above, an integral support can be formed for photovoltaic module 20 which can be interlocked with the respective base substrates of adjacent solar panels 15 in a roof-mounted array to provide easy installation and replacement of individual solar panels as well as to provide effective environmental protection for the interior of the building upon which such roof-mounted solar panel array is located.

As shown in FIG. 1A, base substrate 30 includes a bottom edge portion 31, a top edge portion 33, first side edge 35, second side edge 36, and first and second ridges 37 and 38 that protrude outwardly from a front surface of base substrate 30 and that are respectively disposed parallel and adjacent to first and second side edges 35 and 36. Bottom edge portion 31 includes an extending first lip 32. Top edge portion 33 includes an extending second lip 34. Wires 50 are provided for electrically interconnecting photovoltaic module 20 of solar panel 15 with the other solar panels of the array.

Figure 2:
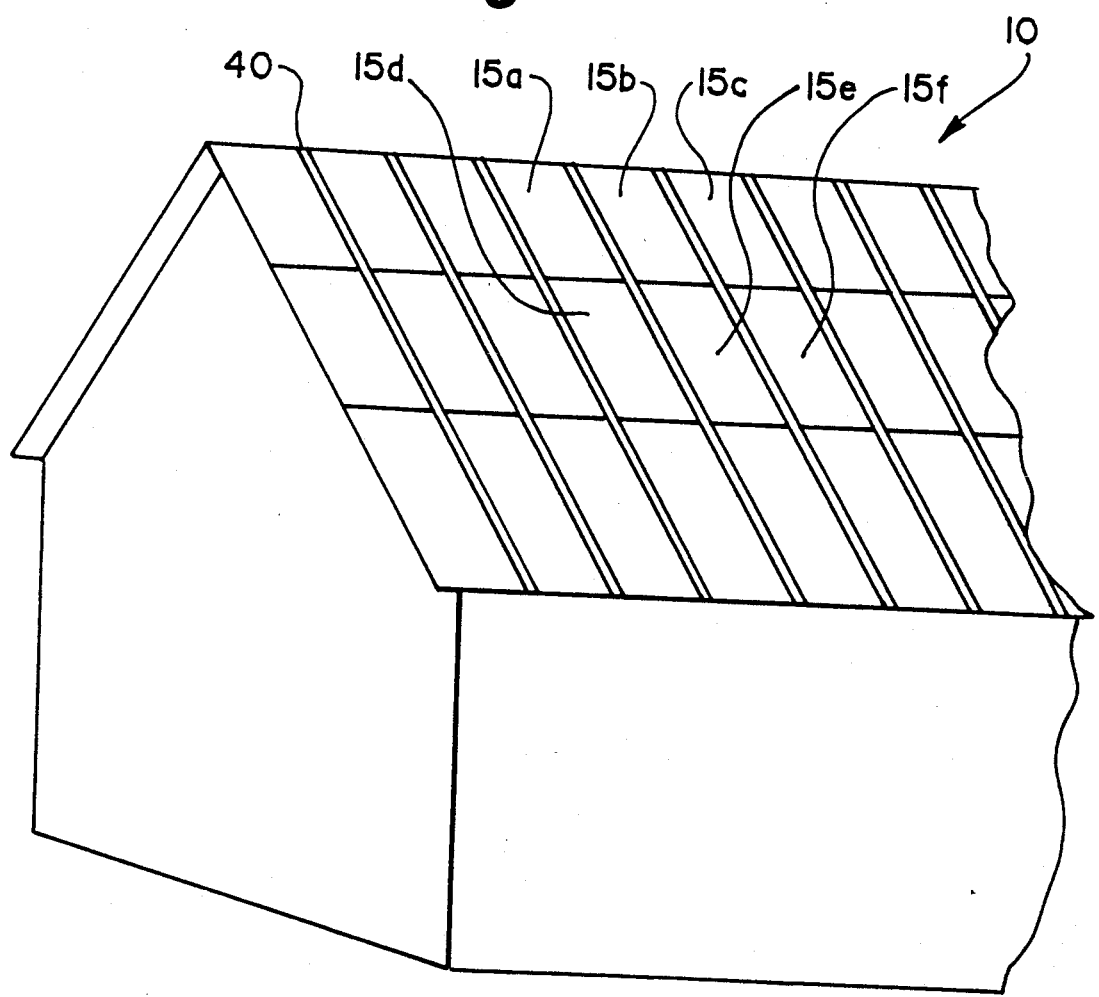
FIG. 2 is a perspective view of a roof-mounted solar panel array provided in accordance with the present invention.

FIG. 2 is a perspective view of a solar panel array 10 mounted directly onto a roof substructure of a building. Solar panels 15a-15e of solar panel array 10 are specifically referred to hereinafter to explain the positional relationship of the solar panels in solar panel array 10. For example, solar panels 15l-15c are top-adjacent relative to solar panels 15d-15f, respectively. Similarly, 15d-15f are bottom-adjacent relative to solar panels 15a-15c, respectively. Further, solar panels 15a, 15b and 15c are hereinafter respectively referred to as side-adjacent relative to each other. Similarly, solar panels 15d, 15e and 15f are side-adjacent relative to each other.

The following description which refers only to these solar panels is given for illustration only, and the description is intended to apply to all solar panels of solar panel array 10 which have positional relationships similar to that which is described below. Further, the description provided herein for solar panel 15 is applicable to any one of the solar panels of solar panel array 10.

FIG. 3 shows a side view of side edge 36 of solar panel 15 as depicted in FIG. 1A and further illustrates the structure of second ridge 38 having a tongue 47 proximate top edge portion 33 of base substrate 30 and a groove 49 proximate bottom edge portion 31 of base substrate 30. The structure and utility of tongue 47 and groove 49 are described more fully below with respect to FIG. 10.

FIG. 4 shows a section view of solar panel 15 taken along line B—B of FIG. 1A. An aspect of the construction of base substrate 30 is shown wherein photovoltaic module 20 is sealed at its back surface and top and bottom edges by base substrate 30. Further, a peripheral portion of the front surface of photovoltaic module 20 is sealed by an overlapping portion 65 of base substrate 30 thereby effecting the partial encapsulation of photovoltaic module 20 within base substrate 30. FIG. 4 also illustrates the configuration of first lip 32 of bottom edge portion 31 of base substrate 30 and second lip 34 of top edge portion 33 of base substrate 30.

FIG. 5 shows a side view of bottom edge portion 31 of solar panel 15, as depicted in FIG. 1A, and illustrates how a groove 48 in first ridge 37 and groove 49 in second ridge 38 are formed.

FIG. 6 shows a section view of solar panel 15 taken along line A—A of FIG. 1A. In FIG. 6, an aspect of the construction of base substrate 30 is shown wherein photovoltaic module 20 is sealed both at its back surface and a peripheral portion of its front surface by base substrate 30.

Figure 7:
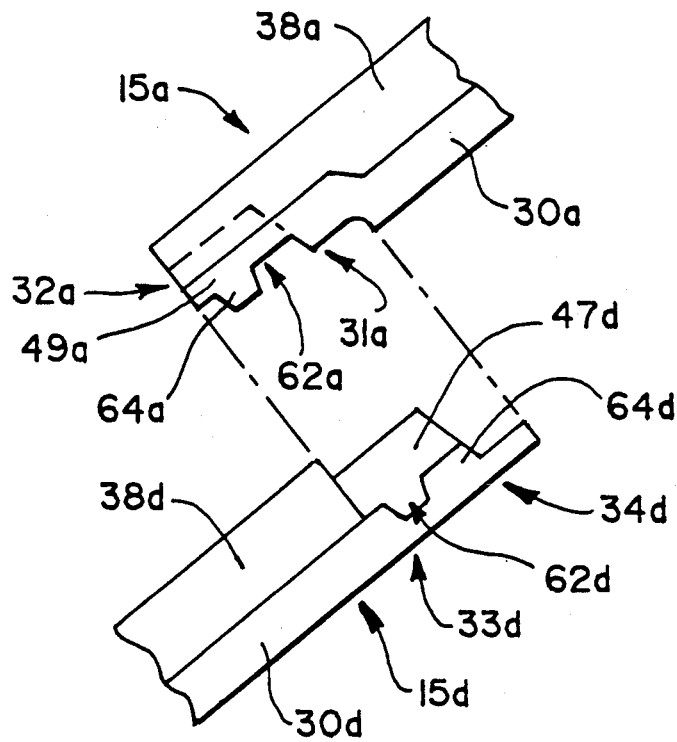
FIG. 7 is an exploded side view of the joint between top/bottom adjacent solar panels in accordance with an embodiment of the present invention.

FIG. 7 illustrates an exploded side view of the joint between a bottom edge portion 31a of solar panel 15a (FIG. 2) and a top edge portion 33d of solar panel 15d (FIG. 2) which is bottom-adjacent relative to solar panel 15a. As seen in FIG. 7, a first lip 32a of bottom edge portion 31a of solar panel 15a is positioned opposite a second lip 34d of top edge portion 33d of bottom-adjacent solar panel 15d. First lip 32a and second lip 34d are respectively configured to matingly interlock with each other in order to provide a watertight joint between top-adjacent and bottom-adjacent solar panels. For completeness, FIG. 7 also illustrates second ridge 38d of solar panel 15d having tongue 47d and second ridge 38a of solar panel 15a having groove 49a for receiving tongue 47d. It is preferred herein to configure first lip 32a and second lip 34d such that the first lip of a bottom edge portion overlaps the second lip of a top edge portion of a bottom-adjacent panel. This preferred arrangement provides a watertight joint that takes into consideration the downward slope of the roof. The configuration of the first and second lips depicted in the drawings shows both lips having horizontally extending raised portions 64a and 63d, and recessed portions 62a and 62d for receiving raised portion 64d and 64a of the other lip. It is preferred to configure the first and second lips such that the back surfaces of the base substrates are flush with one another. This allows better protection of the roof from moisture.

Figure 8A:
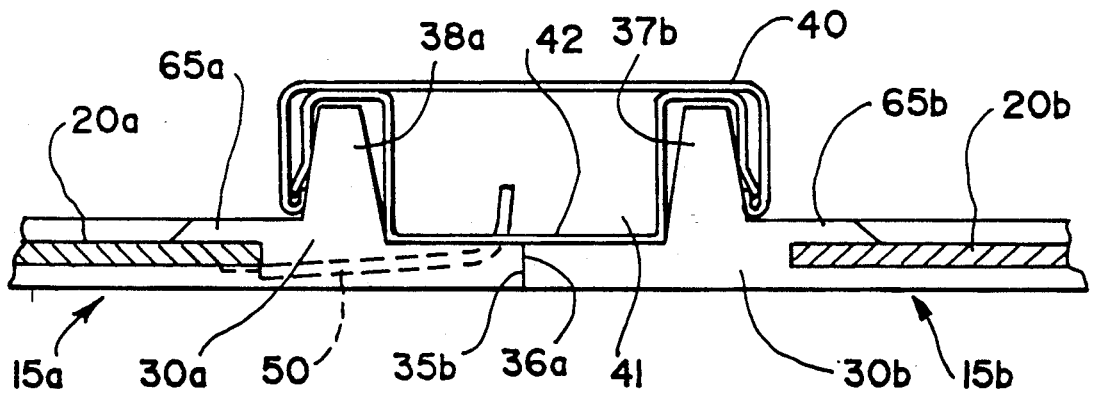
FIG. 8(a) is a section view of the joint between two side-adjacent solar panels in accordance with an embodiment of the present invention.

First and second ridges 37 and 38 are provided on the front surface of base substrate 30 for securing clips 42 between a first or second ridge on one solar panel 15b and the adjacent second or first ridge, respectively, on side-adjacent solar panel 15a or 15c. FIG. 8(a) shows the assembly of solar panel 15a (FIG. 2) and a side-adjacent solar panel 15b (FIG. 2) using a standing seam cap 40. In the embodiment shown in FIG. 8(a), first and second ridges 38a and 37b of abutting solar panels 15a and 15b, respectively, are spaced from first and second side edges 36a and 35b of base substrates 30a and 30b. This construction results in a wiring duct 41 being defined between the first and second ridges 38a and 37b, the standing seam cap 40, and the portion of each base substrate 30a and 30b which extends between the ridge and the adjacent side edge. Wiring duct 41 enables easy routing of the wiring of the solar panels. Wiring duct 41 also provides an area in which the solar panels may be secured to the substructure of the roof, as more fully described below.

Standing seam cap 40 may be made from either metal or plastic and preferably has a length sufficient to extend the entire width (peak to bottom edge) of a planar roof area onto which the array is being mounted. Standing seam cap 40 provides a watertight connection between side-adjacent solar panels as well as with sealed wiring duct 41.

Figure 8B:
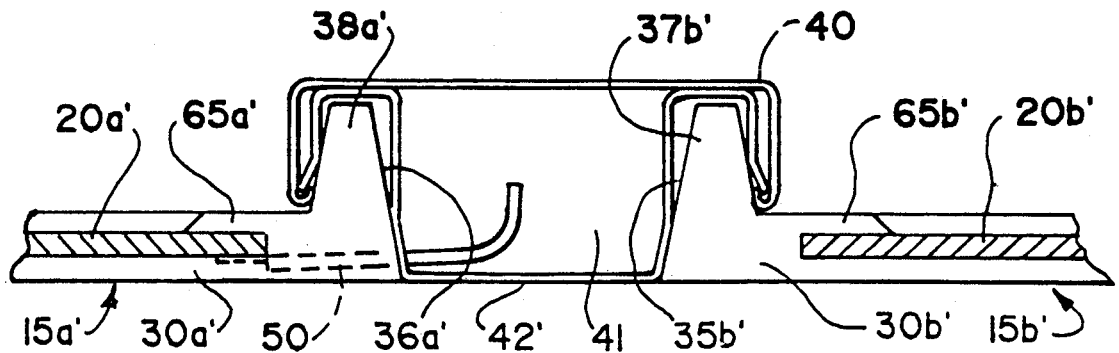
FIG. 8(b) is a section view of the joint between two side-adjacent solar panels in accordance with another embodiment of the present invention.

In accordance with another embodiment shown in FIG. 8(b), two side-adjacent solar panels 15a' and 15b' may instead be spaced apart and first and second ridges 38a' and 37b' may respectively protrude from first and second side edges 36a' and 35b' of base substrates 30a' and 30b'. This construction allows wiring duct 41 to be defined between first and second ridges 38a' and 37b', standing seam cap 40, and the uncovered roof between solar panels 15a' and 15b'.

Figure 9:
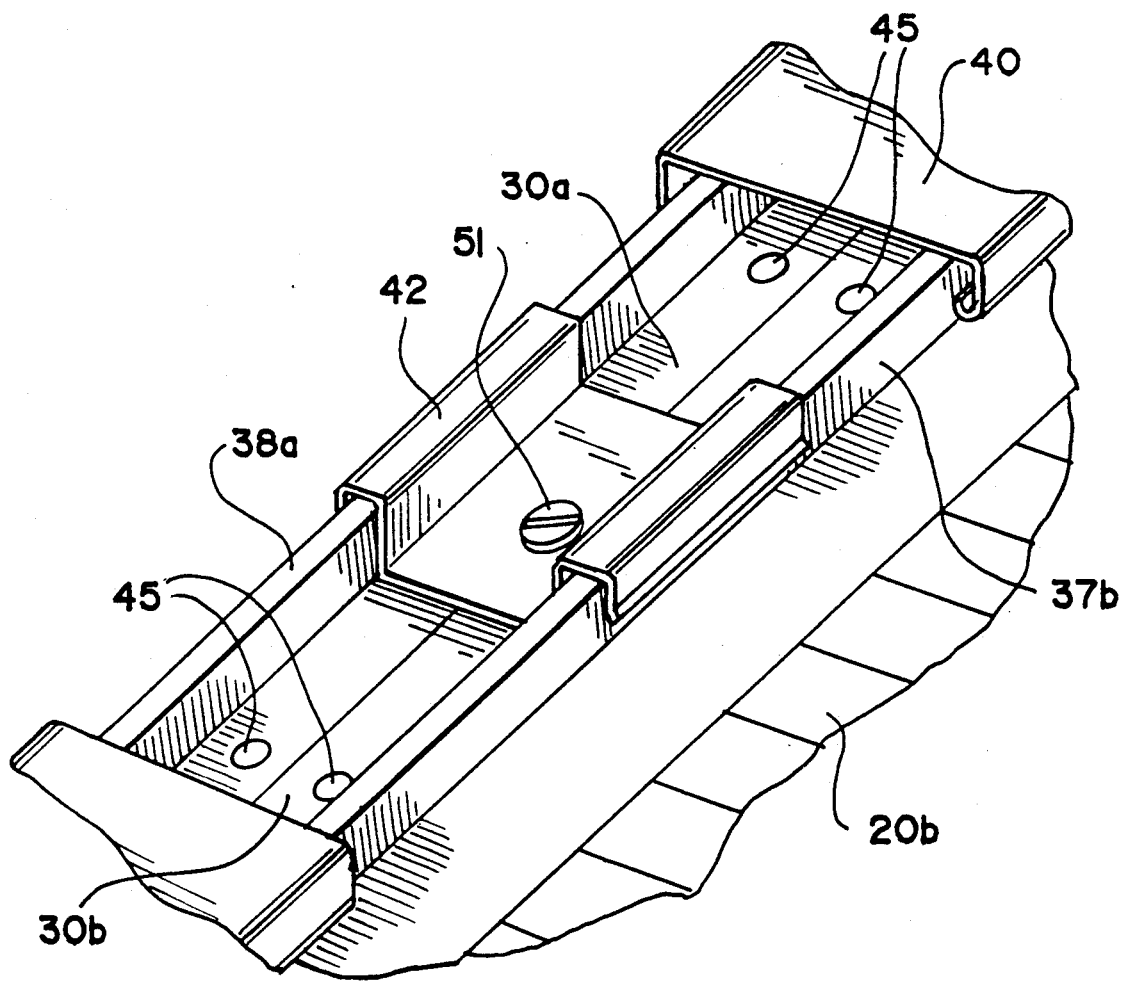
FIG. 9 is a perspective view of the joint between two side-adjacent solar panels in accordance with the embodiment illustrated in FIG. 8(a)

Referring next to FIG. 9, each solar panel 15 is preferably secured to the substructure of the roof by fasteners such as nails 45. Holes (not shown) may be provided through base substrate 30 within the wiring duct 41 to facilitate installation of the solar panels in the case where side-adjacent panels are installed so as to abut one another, such as illustrated in FIG. 8(a). Further, retaining clips 42 are preferably provided beneath seam cap 40, at spaced apart locations along the joint between two side-adjacent panels, to retain the positional relation of the side-adjacent solar panels and to provide further means for securing the side-adjacent panels to the roof. Retaining clips 42 are preferably secured to the roof substructure by means of fasteners such as screws 51. Holes (not shown) may be provided through base substrate 30 to receive screws 51. Retaining clips 42 also serve as a means for securing standing seam cap 40 over the first and second ridges of the side-adjacent solar panels, as shown, for example, in FIGS. 8(a) and 8(b).

As shown in FIG. 1A, first and second ridges 37 and 38 are respectively provided with tongues 46 and 47 proximate top edge portion 33 and grooves 48 and 49 proximate bottom edge portion 31 of solar panel 15. Tongues 46 and 47 and grooves 48 and 49 are preferably provided to prevent water leakage, into wiring duct 41, between the respective ridges of top-adjacent and bottom-adjacent solar panels.

Figure 10:
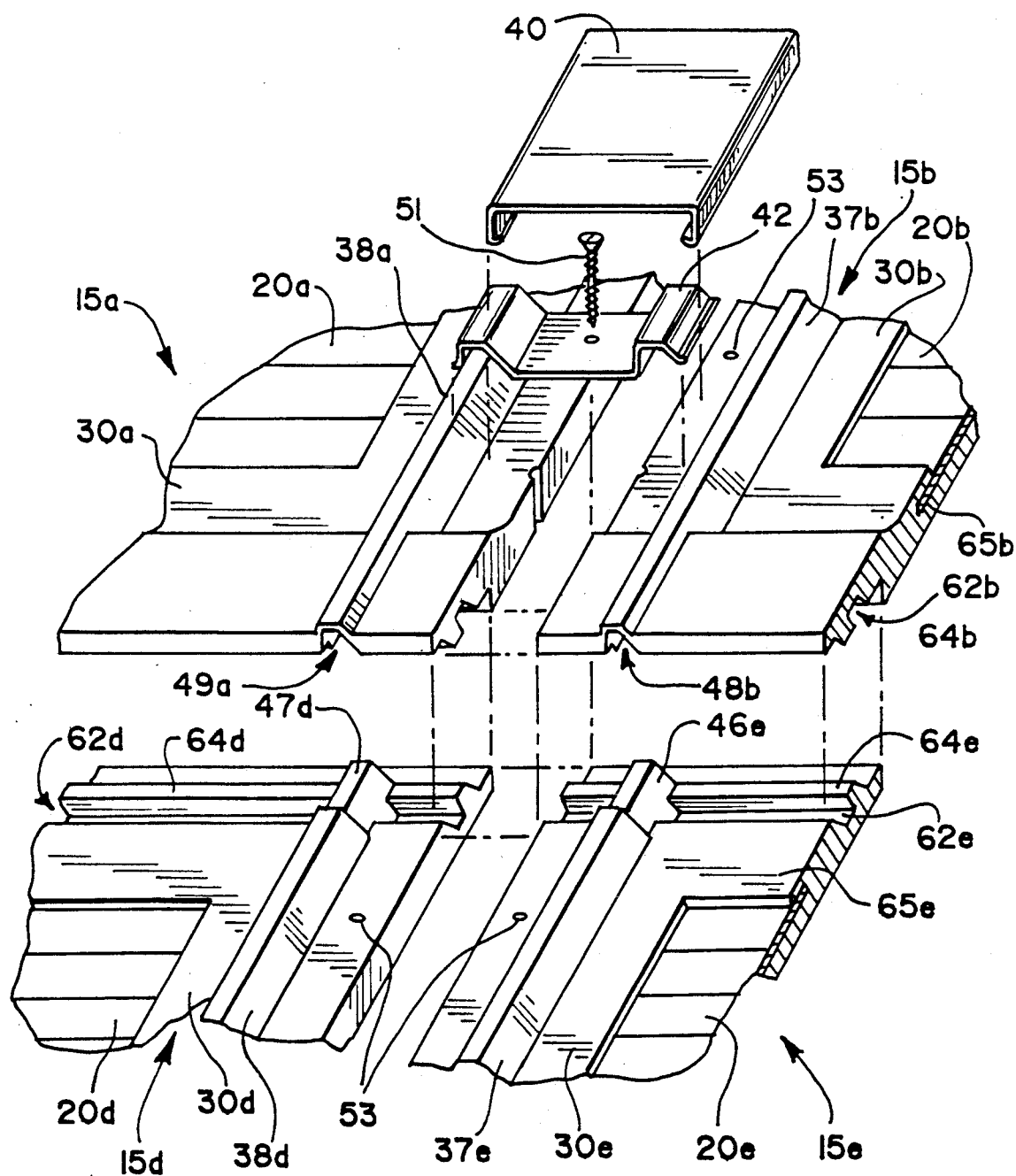
FIG. 10 is an exploded view of the assembly of a solar panel array in accordance with the present invention.

FIG. 10 illustrates an exploded view of the portion of solar panel array 10 (FIG. 2) where the four solar panels 15a, 15b, 15d, and 15e are joined. The reference numerals identifying respective features of each panel are the same as shown in previous figures except that a letter "a", "b", "d" or "e" is appended to each reference numeral to denote its description of a feature that is part of panel 15a, 15b, 15d or 15e, respectively.

Referring to FIG. 10, solar panels 15b and 15e are connected by the mating interconnection of tongue 46e of first ridge 37e of bottom-adjacent solar panel 15e with groove 48b of first ridge 37b of solar panel 15b. Solar panels 15b and 15e are interlocked by overlapping first lip 32b of solar panel 15b onto second lip 34e of solar panel 15e. Solar panels 15a and 15d are connected and interlocked in the same manner as solar panels 15b and 15e. The solar panels are secured to the roof substructure using nails, or any other suitable fastening means, which may be hammered into the roof through holes 53. Solar panels 15a and 15b (and similarly 15d and 15e) are secured to the roof such that their respective ridges are effectively spaced to receive retaining clip 42 and standing seam cap 40. The amount of space provided between side-adjacent solar panels may vary depending on the space between the side edge of a panel and the ridge adjacent thereto. However, it is preferred herein that the side-adjacent panels abut one another as illustrated in FIG. 8(a) and described above.

A plurality of retaining clips 42 are preferably provided to further secure the solar panels to the roof substructure and further to provide a means for securing the standing seam cap 40 to the panels. Each retaining clip is secured to the panels using a screw 51 which preferably also secures the side-adjacent panels to the roof substructure. In the case in which side panels abut, hole 52 is preferably receive screw 51.

It will be apparent to those skilled in the art that various modifications and variations can be made in the general shape of the solar panels of the present invention and in construction of the disclosed solar panel array without departing from the scope or spirit of the invention. As an example the solar panels may have the shape of a non-rectangular parallelogram instead of the rectangular shape depicted in the drawings.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art t utilize the invention in various embodiments and with various modifications as are suited to the particular use contemplated. It is intended that the scope of the invention be defined by the claims appended hereto, and their equivalents.

What is claimed is:

1. A solar panel for use in an array of said solar panels mounted on a roof substructure wherein each panel is secured to a side-adjacent one of said solar panels by a standing seam cap, each of said solar panels comprising:
    a base substrate including
        a front surface,
        a back surface for mounting onto the roof substructure,
        first and second longitudinally extending side edges,
        a bottom edge portion having an extending first lip which includes raised and recessed portions on a back surface of the first lip,
        a top edge portion having an extending second lip which includes raised and recessed portions of a front surface of the second lip which are configured to matingly join with the raised and recessed portions of the first lip of the bottom edge portion of a top-adjacent one of said solar panels, and
        first and second ridges protruding from the front surface and respectively disposed parallel and adjacent to said first and second side edges, each of said first or second ridges being configured to receive the standing seam cap to be mounted thereon and onto the second or first ridge, respectively, of the side-adjacent one of said solar panels; and
    a photovoltaic module mounted on said front surface of said base substrate.

2. The solar panel of claim 1, wherein said first lip is configured to overlap the second lip of the top edge portion of a bottom-adjacent one of said solar panels.

3. The solar panel of claim 1, wherein said front surface of said base substrate includes an overlapping portion that extends over a peripheral edge of said photovoltaic module to secure said photovoltaic module onto said front surface.

4. The solar panel of claim 3, wherein said base substrate is formed by reaction injection molding.

5. The solar panel of claim 1, wherein said first and second ridges are respectively spaced apart from said first and second side edges such that a wiring duct is formed between abutting side-adjacent ones of said solar panels and the standing seam cap.

6. The solar panel of claim 1, wherein said first and second ridges respectively protrude from said first and second side edges such that a wiring duct is formed between side-adjacent ones of said solar panels and the standing seam cap when the respective first and second edges of the side-adjacent panels are mounted on the roof substructure to be spaced apart.

7. The solar panel of claim 1, wherein said first and second ridges each include a tongue proximate said top edge portion of said base substrate and a groove proximate said bottom edge portion of said base substrate, said groove being configured to matingly receive the tongue of a bottom-adjacent one of said solar panels.

8. The solar panel of claim 1, wherein said base substrate has a substantially rectangular shape.

9. The solar panel of claim 1, wherein said first and second ridges protrude substantially perpendicularly to said front surface of said base substrate.

10. The solar panel of claim 1, wherein said first and second longitudinally extending side edges are substantially parallel.

11. A solar panel for use in an array of said solar panels mounted on a roof substructure wherein each panel is secured to a side-adjacent one of said solar panels by a standing seam cap, each of said solar panels comprising:
    a base substrate including
        a front surface,
        a back surface for mounting onto the roof substructure,
        a bottom edge portion,
        a top edge portion,
        first and second longitudinally extending side edges, and
        first and second ridges protruding from the front surface and respectively disposed parallel and adjacent to said first and second side edges, each of said first or second ridges being configured to receive the standing seam cap to be mounted thereon and onto the second or first ridge, respectively, of the side-adjacent one of said solar panels, wherein said first and second ridges each include a tongue proximate said top edge portion of said base substrate and a groove proximate said bottom edge portion of said base substrate, said groove being configured to matingly receive the tongue of a bottom-adjacent one of said solar panels; and
    a photovoltaic module mounted on said front surface of said base substrate.

12. The solar panel of claim 11, wherein said front surface of said base substrate includes an overlapping portion that extends over a peripheral edge of said photovoltaic module to secure said photovoltaic module onto said front surface.

13. The solar panel of claim 12, wherein said base substrate is formed by reaction injection molding.

14. The solar panel of claim 11, wherein said first and second ridges are respectively spaced apart from said first and second side edges such that a wiring duct is formed between abutting side-adjacent ones of said solar panels and the standing seam cap.

15. The solar panel of claim 11, wherein said first and second ridges respectively protrude from said first and second side edges such that a wiring duct is formed between side-adjacent ones of said solar panels and the standing seam cap when the respective first and second edges of the side-adjacent panels are mounted on the roof substructure to be spaced apart.

16. The solar panel of claim 11, wherein said base substrate has a substantially rectangular shape.

17. The solar panel of claim 11, wherein said first and second ridges protrude substantially perpendicularly to said front surface of said base substrate.

18. The solar panel of claim 11, wherein said first and second longitudinally extending side edges are substantially parallel.

19. A solar panel for use in an array of said solar panels mounted on a roof substructure wherein each panel is secured to a side-adjacent one of said solar panels by a standing seam cap, each of said solar panels comprising:
a base substrate including
a front surface,
a back surface for mounting onto the roof substructure,
a bottom edge portion,
a top edge portion,
first and second longitudinally extending side edges, and
first and second ridges protruding from the front surface and respectively disposed parallel and adjacent to said first and second side edges, each of said first or second ridges being configured to receive the standing seam cap to be mounted thereon and onto the second or first ridge, respectively, of the side-adjacent one of said solar panels, wherein said first and second ridges are respectively spaced apart from said first and second side edges such that a wiring duct is formed between abutting side-adjacent ones of said solar panels and the standing seam cap; and
a photovoltaic module mounted on said front surface of said base substrate.

20. The solar panel of claim 19, wherein said front surface of said base substrate includes an overlapping portion that extends over a peripheral edge of said photovoltaic module to secure said photovoltaic module onto said front surface.

21. The solar panel of claim 20, wherein said base substrate is formed by reaction injection molding.

22. The solar panel of claim 19, wherein said base substrate has a substantially rectangular shape.

23. The solar panel of claim 19, wherein said first and second ridges protrude substantially perpendicularly to said front surface of said base substrate.

24. The solar panel of claim 19, wherein said first and second longitudinally extending side edges are substantially parallel.

25. A solar panel for use in an array of said solar panels mounted on a roof substructure wherein each panel is secured to a side-adjacent one of said solar panels by a standing seam cap, each of said solar panels comprising:
a base substrate including
a front surface,
a back surface for mounting onto the roof substructure,
a bottom edge portion,
a top edge portion,
first and second longitudinally extending side edges, and
first and second ridges protruding from the front surface and respectively disposed parallel and adjacent to said first and second side edges, each of said first or second ridges being configured to receive the standing seam cap to be mounted thereon and onto the second or first ridge, respectively, of the side-adjacent one of said solar panels; and
a photovoltaic module mounted on said front surface of said base substrate, wherein said front surface of said base substrate includes an overlapping portion that extends over a peripheral edge of said photovoltaic module to secure said photovoltaic module onto said front surface.

26. The solar panel of claim 25, wherein said bottom edge portion has an extending first lip, and said top edge portion has an extending second lip configured to matingly join with the first lip of the bottom edge portion of a to adjacent one of said solar panels.

27. The solar panel of claim 26, wherein said first lip is configured to overlap the second lip of the top edge portion of a bottom-adjacent one of said solar panels.

28. The solar panel of claim 25, wherein said base substrate is formed by reaction injection molding.

29. The solar panel of claim 25, wherein said first and second ridges are respectively spaced apart from said first and second side edges such that a wiring duct is formed between abutting side-adjacent ones of said solar panels and the standing seam cap.

30. The solar panel of claim 25, wherein said first and second ridges respectively protrude from said first and second side edges such that a wiring duct is formed between side-adjacent ones of said solar panels and the standing seam cap when the respective first and second edges of the side-adjacent panels are mounted on the roof substructure to be spaced apart.

31. The solar panel of claim 25, wherein said first and second ridges each include a tongue proximate said top edge portion of said base substrate and a groove proximate said bottom edge portion of said base substrate, said groove being configured to matingly receive the tongue of a bottom-adjacent one of said solar panels.

32. The solar panel of claim 25, wherein said base substrate has a substantially rectangular shape.

33. The solar panel of claim 25, wherein said first and second ridges protrude substantially perpendicularly to said front surface of said base substrate.

34. The solar panel of claim 25, wherein said first and second longitudinally extending side edges are substantially parallel.

35. A solar panel array for mounting on a roof substructure, comprising:
a plurality of standing seam caps; and
a plurality of solar panels;
each said solar panel comprising:
a base substrate including
a front surface,
a back surface for mounting onto the roof substructure,
a bottom edge portion having an extending first lip which includes raised and recessed portions on a back surface of the first lip,
a top edge portion having an extending second lip which includes raised and recessed portions on a front surface of the second lip which are configured to matingly join with the raised and recessed portions of the first lip of the bottom edge portion of a top-adjacent one of said solar panels, first and second longitudinally extending side edges, and first and second ridges protruding from the front surface and respectively disposed parallel and adjacent to said first and second side edges, each of said first or second ridges being configured to receive one of said plurality of standing seam caps to be mounted thereon and onto the second or first ridge, respectively, of a side-adjacent one of said solar panels; and a photovoltaic module mounted on said front surface of said base substrate.

36. The solar panel of claim 35, wherein said first and second ridges are respectively spaced apart from said first and second side edges such that a wiring duct is formed between abutting side-adjacent ones of said solar panels and the standing seam cap.

37. The solar panel of claim 35, wherein said first and second longitudinally extending side edges are substantially parallel.

38. A solar panel array for mounting on a roof substructure, comprising:
a plurality of standing seam caps; and
a plurality of solar panels;
each said solar panel comprising:
a base substrate including
a front surface,
a back surface for mounting onto the roof substructure,
a bottom edge portion,
a top edge portion,
first and second longitudinally extending side edges, and
first and second ridges protruding from the front surface and respectively disposed parallel and adjacent to said first and second side edges, each of said first or second ridges being configured to receive one of said plurality of standing seam caps to be mounted thereon and onto the second or first ridge, respectively, of a side-adjacent one of said solar panels; and
a photovoltaic module mounted on said front surface of said base substrate, wherein said front surface of said base substrate includes an overlapping portion that extends over a peripheral edge of said photovoltaic module to secure said photovoltaic module onto said front surface.

39. The solar panel of claim 38, wherein said first and second ridges are respectively spaced apart from said first and second side edges such that a wiring duct is formed between abutting side-adjacent ones of said solar panels and the standing seam cap.

40. The solar panel of claim 38, wherein said first and second longitudinally extending side edges are substantially parallel.

41. A solar panel for use in an array of said solar panels mounted on a roof substructure wherein each panel is secured to a side-adjacent one of said solar panels by a standing seam cap, each of said solar panels comprising:
a base substrate formed by reaction injection molding and having a substantially rectangular shape, including
a front surface,
a back surface for mounting onto the roof substructure,
first and second substantially parallel and longitudinally extending side edges,
a bottom edge portion having an extending first lip,
a top edge portion having an extending second lip configured to matingly join with the first lip of the bottom edge portion of a top-adjacent one of said solar panels, said first lip being configured to overlap the second lip of the top edge portion of a bottom-adjacent one of said solar panels, and
first and second ridges protruding substantially perpendicularly from the front surface and respectively disposed parallel and spaced apart from said first and second side edges, each of said first or second ridges being configured to receive the standing seam cap to be mounted thereon and onto the second or first ridge, respectively, of the side-adjacent one of said solar panels, said first and second ridges each including a tongue proximate said top edge portion of said base substrate and a groove proximate said bottom edge portion of said base substrate, said groove being configured to matingly receive the tongue of a bottom-adjacent one of said solar panels; and
a photovoltaic module mounted on said front surface of said base substrate, wherein said front surface of said base substrate includes an overlapping portion that extends over a peripheral edge of said photovoltaic module to secure said photovoltaic module onto said front surface.

* * * * *